(12) United States Patent
Miller

(10) Patent No.: US 7,042,239 B1
(45) Date of Patent: May 9, 2006

(54) ARRANGEMENT FOR MANUAL DISENGAGEMENT OF A DEVICE INTERFACE BOARD FROM A PERSONAL TESTER

(75) Inventor: Wayne H. Miller, Los Altos, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/877,479

(22) Filed: Jun. 25, 2004

(51) Int. Cl.
*G01R 31/02* (2006.01)
*G01R 31/28* (2006.01)

(52) U.S. Cl. .................... 324/755; 324/754; 324/158.1
(58) Field of Classification Search .................... 439/8, 439/10, 55–85, 43–54, 92–108, 151–160, 439/246–257, 260, 266–270, 278, 296, 476.1–483, 439/894, 901–906
See application file for complete search history.

(56) References Cited

U.S. PATENT DOCUMENTS

| 4,758,780 A | 7/1988 | Coon et al. |
| 5,321,453 A | 6/1994 | Mori et al. |
| 5,450,766 A | 9/1995 | Holt |
| 5,656,942 A | 8/1997 | Watts et al. |
| 5,828,223 A | 10/1998 | Rabkin et al. |
| 5,936,415 A | 8/1999 | Fredrickson |
| 6,220,870 B1 * | 4/2001 | Barabi et al. .................. 439/71 |
| 6,261,114 B1 * | 7/2001 | Shimada ..................... 439/266 |
| 6,296,505 B1 * | 10/2001 | Fukunaga et al. .......... 439/268 |
| 6,762,599 B1 | 7/2004 | Miller |

* cited by examiner

*Primary Examiner*—Paresh Patel
*Assistant Examiner*—Roberto Velez
(74) *Attorney, Agent, or Firm*—John Smith-Hill; Smith-Hill and Bedell

(57) ABSTRACT

A semiconductor integrated circuit tester includes a housing having a main housing wall formed with an opening. A tester interface unit is located partially in the housing and incorporates an electrical connector segment that extends partially from the main housing wall for engaging an electrical connector segment of a device interface unit. A pusher member is located partially within the housing and is movable relative to the main housing wall between an extended position and a retracted position. In the extended position the pusher member projects from the opening in the main housing wall. An actuator is accessible at the exterior of the housing and is coupled to the pusher member for moving the pusher member between its retracted position and its extended position.

11 Claims, 2 Drawing Sheets

ARRANGEMENT FOR MANUAL DISENGAGEMENT OF A DEVICE INTERFACE BOARD FROM A PERSONAL TESTER

BACKGROUND OF THE INVENTION

This invention relates to an arrangement for manual disengagement of a device interface board from a personal tester.

Copending U.S. patent application Ser. Nos. 10/234,496 and 10/234,497, the entire disclosure of each of which is hereby incorporated by reference herein for all purposes, disclose a semiconductor integrated circuit tester that is designed for personal use by a technician or engineer in a laboratory rather than for production use in a manufacturing facility. In one implementation, the tester includes pin electronics implemented on a main circuit board mounted in a generally parallelpipedal housing. The main circuit board has a tester interface that is exposed at one main face of the housing and includes several tester interface pin headers. A device interface board or load board, which serves as a spatial transformer between the tester interface pin headers and a device under test (DUT) socket for receiving a DUT, has receptacles that engage the tester interface pin headers.

An implementation of the personal tester described above is sold by Credence Systems Corporation under the designation PERSONAL KALOS.

The personal tester may be positioned on or adjacent to the user's workbench, and when the user wishes to test a device of a particular type, he selects the appropriate load board, engages the receptacles of the load board with the tester interface pin headers of the tester, and installs the DUT in the DUT socket of the load board. When the user wishes to test a device of a different type, it will generally be necessary for him to remove the current load board and engage the load board for the new type of device with the tester interface. Typically, the user will position the tester with the pin headers upward and it is then easy and convenient to engage the receptacles of the load board with the pin headers using manual force to push the load board down relative to the tester. In order to disengage the device interface board from the pin headers, the user may pull the load board upwards relative to the pin headers. There is danger in these circumstances that the user will inadvertently tilt the load board, which may result in the pins of the load board receptacles or the pins of the tester interface pin headers being bent or otherwise damaged. There is also a possibility that flexing of the load board will damage the load board itself.

SUMMARY OF THE INVENTION

In accordance with the invention there is provided a semiconductor integrated circuit tester for use in conjunction with a device interface unit (34) that includes a first electrical connector segment (38), the tester comprising a housing having a main housing wall (18) formed with at least one opening, a tester interface unit that is located partially in the housing and incorporates a second electrical connector segment (22) that extends at least partially from the main housing wall for engaging the first electrical connector segment of the device interface unit, a pusher member (30) that is located at least partially within the housing and is movable relative to the main housing wall between an extended position and a retracted position, and wherein in the extended position the pusher member projects from the opening in the main housing wall, and an actuator 48 that is accessible exteriorly of the housing and is operatively coupled to the pusher member for moving the pusher member between its retracted position and its extended position, whereby in the event that the second electrical connector segment is engaged with the first electrical connector segment, the actuator can be operated to move the pusher member from its retracted position to its extended position for forcing the device interface unit away from the main housing wall and disengaging the first electrical connector segment from the second electrical connector segment.

BRIEF DESCRIPTION OF THE DRAWINGS

For a better understanding of the invention, and to show how the same may be carried into effect, reference will now be made, by way of example, to the accompanying drawings, in which.

Figure 1:
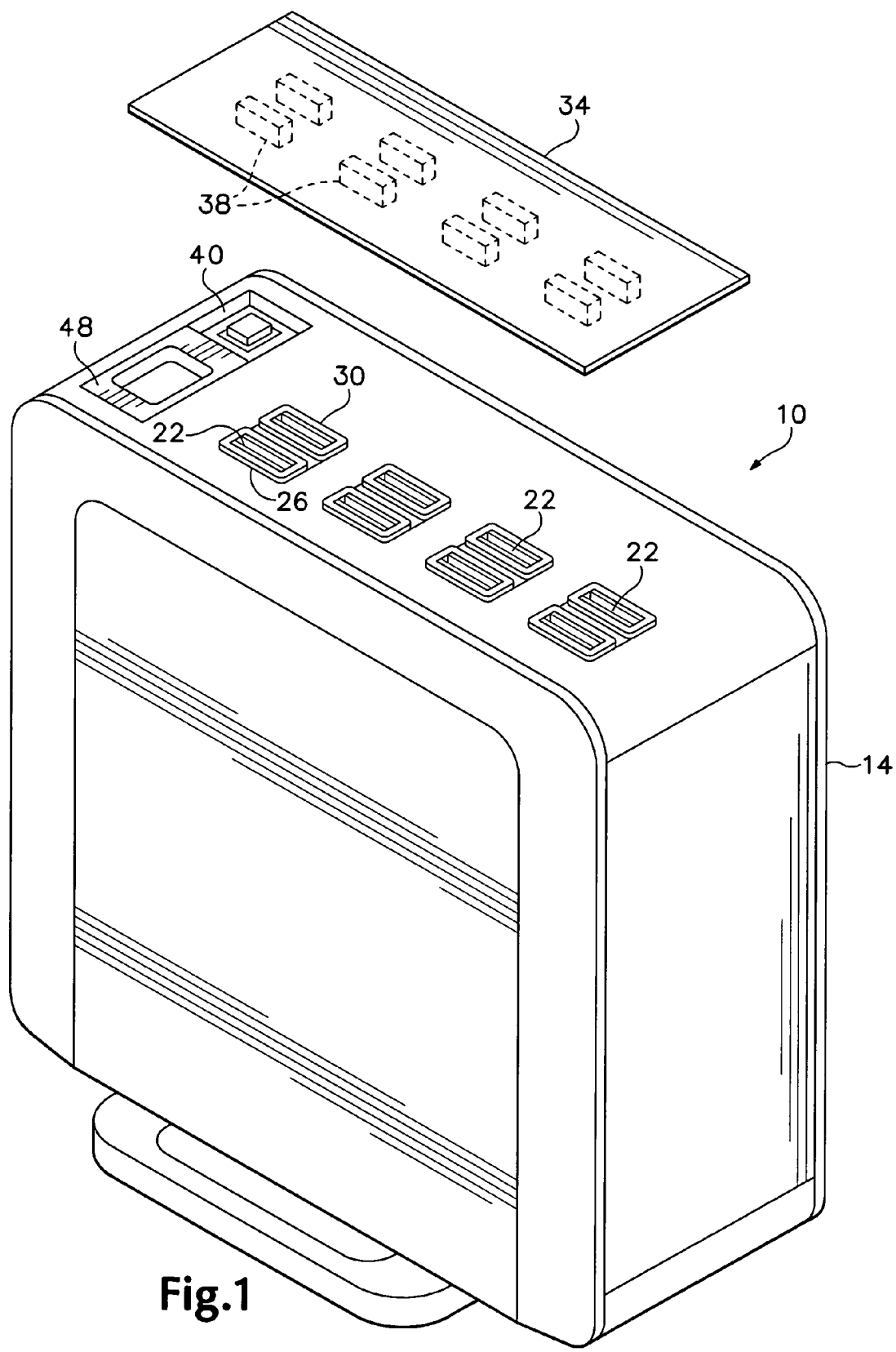
FIG. 1 is a perspective view of a semiconductor integrated circuit tester.

In this specification, words of orientation and position, such as upper and lower, above and below, are used to establish orientation and position relative to the views shown in the drawings and are not used in a absolute sense.

DETAILED DESCRIPTION

Figure 2:
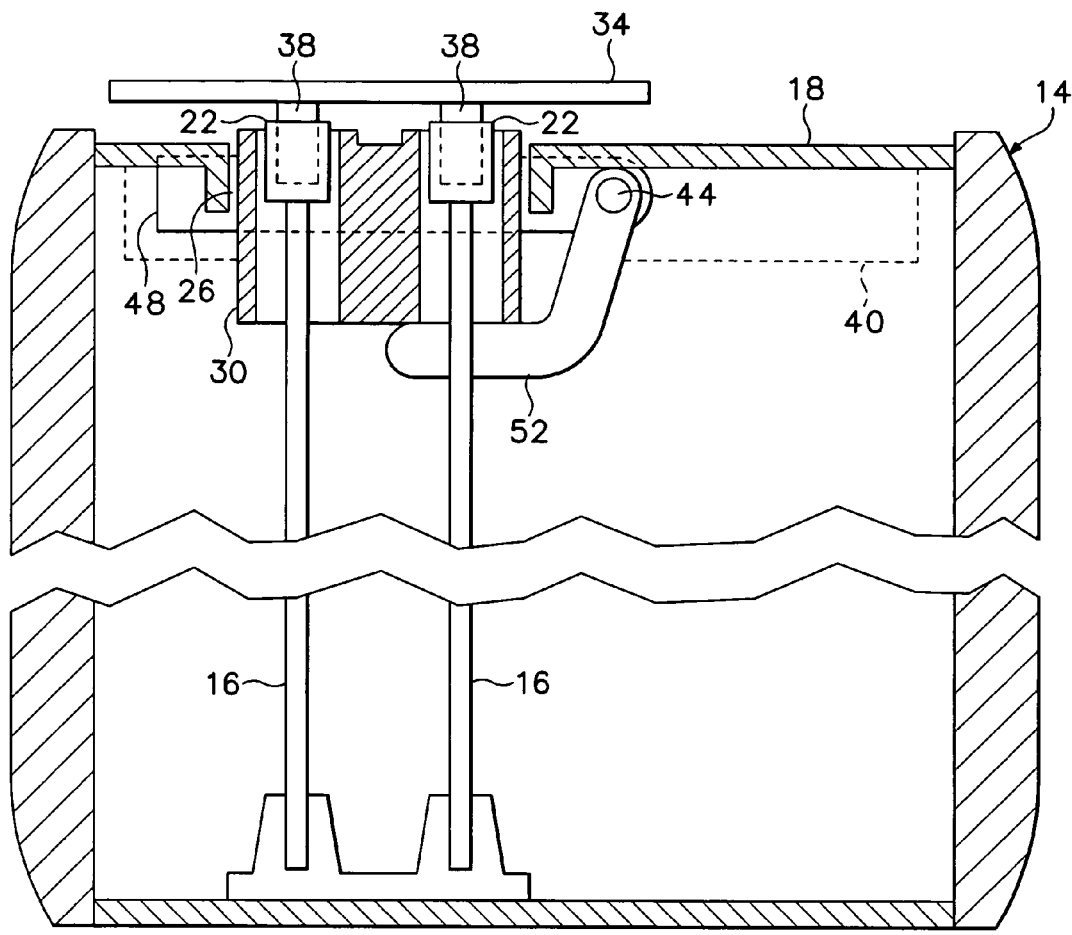
FIG. 2 is a partially broken-away sectional view of the tester in a first condition.
Figure 3:
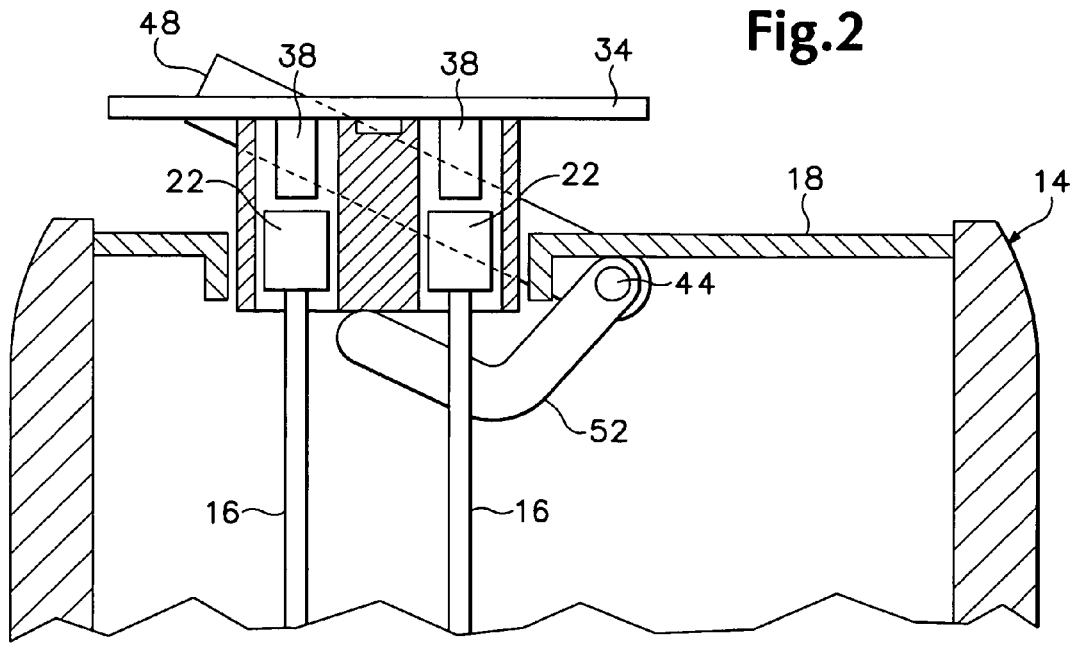
FIG. 3 is a similar view of the tester in a second condition.

FIGS. 1–3 illustrate a semiconductor integrated circuit tester 10 that is designed for testing flash memory devices. The tester 10 comprises a housing 14 containing two tester main boards 16 that are disposed parallel to each other and perpendicular to a tester interface wall 18 of the housing 14. The pin electronics of the tester, including tester circuits (not shown) such as drivers and comparators for supplying and receiving test signals, are implemented on the main boards 16. Four shrouded pin headers 22 (the pins are not shown) are attached to the upper edge of each main board 16 and project from the housing 14 through openings 26 in the tester interface wall 18. The main boards are secured against movement relative to the interface wall 18. In FIG. 2, the main boards are secured to a housing wall opposite, and parallel to, the interface wall 18. Accordingly the pin headers 22 also are secured against movement, particularly vertical movement, relative to the interface wall.

The pin headers 22, which include ground pins, power supply pins, and signal pins, form a main tester interface. The signal pins are connected to the tester circuits of the pin electronics of the respective main boards.

Each opening 26 accommodates a pair of pin headers 22 (one on each main board). The two pin headers of each pair are surrounded by a pusher frame 30 made of a molded synthetic polymer material. The polymer material that is selected is substantially rigid. Whereas the main boards and the pin headers are mounted in the housing so that they are held stationary relative to the interface wall 18 of the housing, the pusher frames are supported in the respective openings 26 so that they are moveable perpendicular to the interface wall 18.

The tester is used in conjunction with a load board or device interface board 34 having four pairs of receptacles 38 on its lower face and one or more DUT sockets (not shown) on its upper face. In operation, the load board is positioned so that the receptacles 38 are aligned with the rectangular shrouds of the pin headers 22 respectively and the user pushes the load board 34 downwards relative to the main housing 14 and the receptacles engage the pin headers.

The interface wall 18 is formed with a recess 40 that is traversed by a shaft 44 that is journalled in bearings (not shown) that allow the shaft to rotate relative to the housing while holding the shaft parallel to the upper edges of the main boards 16. A handle 48 is attached to the shaft 44 within the recess 40. Rotational movement of the shaft 44 in its bearings allows the handle 48 to pivot relative to the interface wall 18 between a home position (FIG. 1) in which it is fully accommodated in the recess and an extended position (FIG. 3) in which it projects upward from the recess. The shaft is mechanically coupled to the four pusher frames 30 so that pivotal movement of the handle from the home position to the extended position results in the frames being forced upward relative to the top wall of the housing. Pivotal movement of the handle in the opposite direction allows the pusher frames to move downward.

In use of the illustrated tester, the user installs a load board by aligning the receptacles on the load board with the pin headers 22 at the interface wail lb while the handle is in the lowered or home position (FIG. 1) and then pushes the load board vertically downwards, thereby connecting the pin electronics circuits on the main boards with the DUT sockets on the load board by way of the connectors that are constituted by the pin headers and corresponding receptacles (FIG. 2). In the event that the user wishes to remove the load board, he pivots the handle 48 towards the extended position (FIG. 3). By this action, the pusher frames 30 are raised relative to the interface wall 18 of the tester housing and a pushing surface of each pusher frame 30 is brought to bear against the underside of the load board 34. As the user continues to apply force to the handle, the pusher frames are forced upward, thereby forcing the load board upward and disengaging the receptacles from the pin headers.

Use of the handle 48 to raise the pusher frames 30 ensures that the load board is disengaged from the tester by movement along the axis of alignment of the receptacles with the pin headers, thus avoiding bending of the pins or excessive flexing of the DUT board itself.

The mechanism that is used to convert rotational movement of the shaft 44 to linear movement of the pusher frames 30 is shown only schematically, as a lever 52 engaging one of the frames. It will be appreciated that many mechanisms that might or might not resemble the illustrated mechanism may be used to perform this function.

It will be appreciated that the invention is not restricted to the particular embodiment that has been described, and that variations may be made therein without departing from the scope of the invention as defined in the appended claims and equivalents thereof. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

The invention claimed is:

1. A semiconductor integrated circuit tester for use in conjunction with a device interface unit that includes a first electrical connector segment, the tester comprising:

a housing having an interior, a main housing wall, partially bounding the interior and formed with at least one opening, and an opposing housing wall, partially bounding the interior and substantially parallel to the main housing wall, a tester interface unit that is located partially in the housing and incorporates a second electrical connector segment for engaging in electrically conductive contact with the first electrical connector segment of the device interface unit, a pusher member that is located at least partially within the housing and is movable relative to the main housing wall between an extended position and a retracted position, and wherein the pusher member is closer to the opposing housing wall in the retracted position than in the extended position and in the extended position the pusher member projects from the interior through the opening in the main housing wall for engaging the device interface unit, and an actuator that is accessible exteriorly of the housing and is operatively coupled to the pusher member for moving the pusher member between its retracted position and its extended position, whereby in the event that the second electrical connector segment is engaged with the first electrical connector segment, the actuator can be operated to move the pusher member from its retracted position to its extended position for forcing the device interface unit away from the main housing wall and disengaging the first electrical connector segment from the second electrical connector segment.

2. A tester according to claim 1, wherein the actuator is operatively coupled to the pusher member by a shaft that is journalled in the housing and the actuator comprises a lever that is attached to the shaft and is pivotable relative to the housing to affect rotation of the shaft.

3. A tester according to claim 1, wherein the second electrical connector segment comprises a generally rectangular member that is located in the opening and the pusher member comprises a frame that is located in the opening and surrounds the second electrical connector segment.

4. A tester according to claim 1, wherein the main housing wall is formed with at least two openings, the tester interface unit incorporates at least two second electrical connector segments that extend at least partially from the main housing wall for engaging in electrically conductive contact with respective first electrical connector segments of the device interface unit, the tester includes at least two pusher members that are located at least partially within the housing and are each movable relative to the main housing wall between an extended position and a retracted position, and wherein the pusher members are close to the opposing housing wall in the retracted position than in the extended position and in the extended position the pusher members project from respective openings in the main housing wall, and the actuator is operatively coupled to each pusher member for moving the pusher member between its retracted position and its extended position.

5. A tester according to claim 1, wherein the pusher member includes a pushing surface substantially parallel to the main housing wall, and, in the extended position, the pushing surface projects from the opening in the main housing wall for engaging the device interface unit.

6. In combination, a semiconductor integrated circuit tester and a device interface unit that includes a first electrical connector segment, wherein the tester comprises:

a housing having an interior and a main housing wall partially bounding the interior and formed with at least one opening providing access to the interior, a tester interface unit that is located partially in the interior of the housing and incorporates a second electrical connector segment for engaging in electrically conductive contact the first electrical connector segment of the device interface unit, a pusher member being located at least partially within the interior of the housing and movable relative to the main housing wall between an extended position and a retracted position, wherein in the extended position the pusher member projects from the interior through the opening in the main housing wall for engaging the device interface unit, and an actuator that is accessible exteriorly of the housing and is operatively coupled to the pusher member for moving the pusher member between its retracted position and its extended position, whereby in the event that the second electrical connector segment is engaged with the first electrical connector segment, the actuator can be operated to move the pusher member from its retracted position to its extended position for forcing the device interface unit away from the main housing wall and disengaging the first electrical connector segment from the second electrical connector segment.

7. A combination according to claim 6, wherein the actuator is operatively coupled to the pusher member by a shaft that is journalled in the housing and the actuator comprises a lever that is attached to the shaft and is pivotable relative to the housing to effect rotation of the shaft.

8. A combination according to claim 6, wherein the second electrical connector segment comprises a generally rectangular member that is located in the opening and the pusher member comprises a frame that is located in the opening and surrounds the second electrical connector segment.

9. A combination according to claim 6, wherein the main housing wall is formed with at least two openings, the tester interface unit incorporates at least two second electrical connector segments that extend at least partially from the main housing wall for engaging in electrically conductive contact with the respective first electrical connector segments of the device interface unit, the tester includes at least two pusher members that are located at least partially within the housing and are each movable relative to the main housing wall between an extended position and a retracted position, and wherein in the extended position the pusher members project from respective openings in the main housing wall, and the actuator is operatively coupled to each pusher member for moving the pusher member between its retracted position and its extended position.

10. A combination according to claim 6, wherein the pusher member includes a pushing surface substantially parallel to the main housing wall, and, in the extended position, the pushing surface projects from the interior through the opening in the main housing wall for engaging the device interface unit.

11. A combination according to claim 6, wherein the housing has an opposing housing wall, partially bounding the interior and substantially parallel to the main housing wall and the pusher member is closer to the opposing housing wall in the retracted position than in the extended position.

* * * * *